United States Patent
Liu et al.

(10) Patent No.: US 6,350,707 B1
(45) Date of Patent: Feb. 26, 2002

(54) METHOD OF FABRICATING CAPACITOR DIELECTRIC

(75) Inventors: Tse-Wei Liu, Hsinchu; Jumn-Min Fan, Hsinchu Hsien; Weichi Ting, Kaohsiung, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/389,999

(22) Filed: Sep. 3, 1999

(51) Int. Cl.⁷ ................................................ H01L 21/31
(52) U.S. Cl. ...................... 438/791; 438/238; 438/253; 438/396; 438/762; 438/775; 438/783; 438/787; 438/791; 257/308
(58) Field of Search ................................. 438/791, 954, 438/787, 238, 396, 775, 762, 253, 783; 257/308

(56) References Cited

U.S. PATENT DOCUMENTS

| | | | | |
|---|---|---|---|---|
| 5,250,456 A | * | 10/1993 | Bryant | 438/238 |
| 5,407,870 A | * | 4/1995 | Okada et al. | 438/239 |
| 5,663,087 A | * | 9/1997 | Yokozawa | 438/762 |
| 5,889,301 A | * | 3/1999 | Tseng | 257/308 |
| 5,943,569 A | * | 8/1999 | Shih et al. | 438/253 |
| 5,981,404 A | * | 11/1999 | Sheng et al. | 438/791 |
| 6,093,617 A | * | 7/2000 | Su et al. | 438/398 |
| 6,171,978 B1 | * | 1/2001 | Linn et al. | 438/775 |
| 6,200,844 B1 | * | 3/2001 | Huang | 438/238 |
| 6,235,648 B1 | * | 5/2001 | Mizuhara et al. | 438/783 |

* cited by examiner

Primary Examiner—Matthew S. Smith
Assistant Examiner—Belur V Keshaven
(74) Attorney, Agent, or Firm—Thomas, Kayden, Horstemeyer & Risley

(57) ABSTRACT

The present invention provides a method of fabricating capacitor dielectric layer. A bottom electrode covered by a native oxide layer on a chip is provided. The chip is disposed into a low pressure furnace. A mixture of dichlorosilane and ammonia is introduced into the low pressure furnace to form a nitride layer on the native oxide layer. In the same low pressure furnace, nitrogen monoxide or nitric oxygen is infused to form an oxynitride layer on the nitride layer.

19 Claims, 3 Drawing Sheets

METHOD OF FABRICATING CAPACITOR DIELECTRIC

BACKGROUND OF THE INVENTION

1. Field of the Invention

The invention relates to a method for fabricating a dielectric layer, and more particularly, to a method to fabricating capacitor dielectric layer.

2. Description of the Related Art

The factors to determine a capacitance of a capacitor includes the surface area of the electrode plates, the distance between the electrode plates, and the dielectric constant of the capacitor dielectric layer. Using a dielectric layer with a high dielectric constant can increase the amount of charges storage of a capacitor. However, a dielectric layer with a high dielectric constant also has effects on current leakage speed and breakdown voltage, so that this kind of materials are suitable for use upon application of low operation voltage.

A very common material used in a conventional dynamic random access memory includes a stack of an oxide layer, a nitride layer and another oxide layer. This is the so called ONO structure. The thickness of the middle nitride layer dominates over the overall thickness of the ONO structure. Therefore, the dielectric constant of ONO structure is basically determined by the dielectric constant of the nitride layer. However, the equivalent dielectric constant of the ONO structure is lower than that of a single nitride layer due to the existence of the oxide layers. Typically, in the ONO structure, the first oxide layer is a native oxide layer grown on a bottom electrode, whereas the second oxide layer is to provide a better surface on the nitride layer for the deposition of a top electrode.

The conventional method for forming ONO dielectric layer for a capacitor comprises a series of thermal treatments in different gas environment, so that a variety of furnace may be required. First of all, after the formation of a bottom electrode on a chip, the bottom electrode is in contact with air to form a native oxide layer which is difficult to be removed. The chip is then disposed into a fast thermal processing system with a rapidly raised temperature and an inflow of a mixture of ammonia ($NH_3$) and dichlorosilane ($SiH_2Cl_2$). A nitride layer with a required thickness is thus formed on the native oxide layer.

The chip is then shifted into an atmospheric pressure furnace with moisture or wet oxygen. The furnace is heated up to 850 degree Celsius for about 15–30 minutes. An oxide layer is formed with a thickness thinner than that of the nitride layer since it is more difficult to oxidize the nitride surface. An ONO structure is thus formed.

In the above description, rapidly temperature raising furnace and atmospheric pressure furnace are required to form the ONO structure, and while transporting the chip from one furnace to another, contamination is inevitable. Furthermore, since a rapidly temperature raising furnace can contain less amounts of chips compared to the atmospheric pressure furnace, so the throughput is limited.

SUMMARY OF THE INVENTION

In the invention, an in situ process is adapted. That, different gases are infused into an identical reaction furnace at different steps, so that a nitride layer and an oxide layer is formed by a simplified process. Since the low pressure vertical furnace can contain a larger amount of chips compared to the conventional furnace, the throughput can be enhanced. Furthermore, there is a possibility for forming an oxynitride layer between the native oxide layer and the polysilicon bottom electrode. Therefore, the pinholes of the silicon nitride is filled to prevent leakage current and ion penetration.

It is to be understood that both the foregoing general description and the following detailed description are exemplary and explanatory only and are not restrictive of the invention, as claimed.

DESCRIPTION OF THE PREFERRED EMBODIMENTS

FIG. 1A to FIG. 1D show an embodiment for fabricating a capacitor dielectric according to the invention.

Figure 1A:
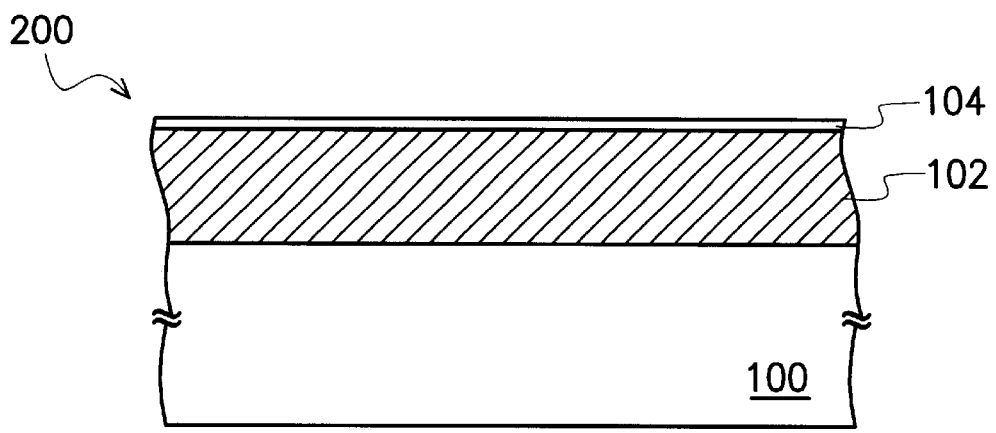
FIG. 1A to FIG. 1D show a fabrication process of a capacitor dielectric layer according to the invention.

In FIG. 1A, a chip 200 comprising a substrate 100 having semiconductor devices such as metal oxide semiconductor device (not shown) formed thereon is provided. A bottom electrode 102 is formed on the substrate 100. The bottom electrode 102 comprises, for example, a polysilicon layer formed by chemical vapor deposition (CVD). The bottom electrode is disposed in an oxygen contained environment, so that a thin oxide layer, namely, a native oxide layer 104, is formed on the bottom electrode 102.

Figure 1B:
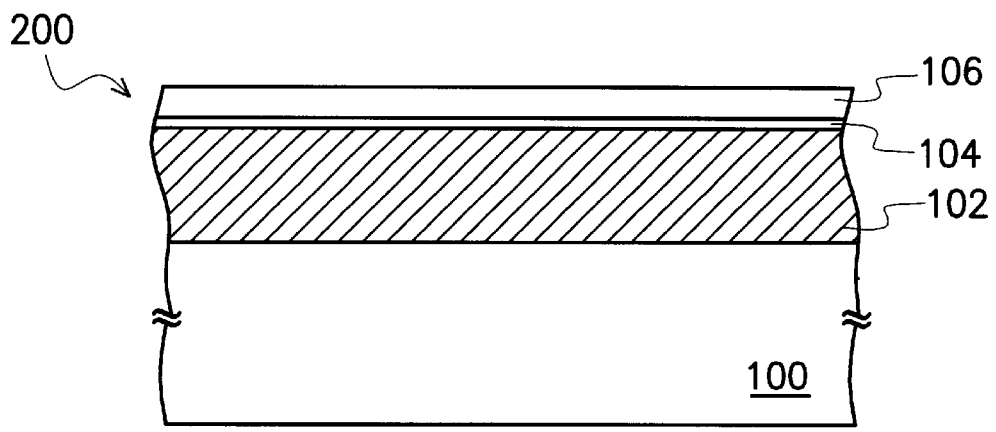

In FIG. 1B, the chip 200 is disposed into a low pressure furnace 300. A nitirde layer 106 is formed on the native oxide layer 104. For example, a mixture of dichlorosilane and ammonia gases is infused into the low pressure furnace 300 to produce a reaction, whereas the reaction temperature is about 750–850 degree Celsius. The nitride layer 106 is formed with a thickness of about 10–70 angstroms.

Figure 1C:
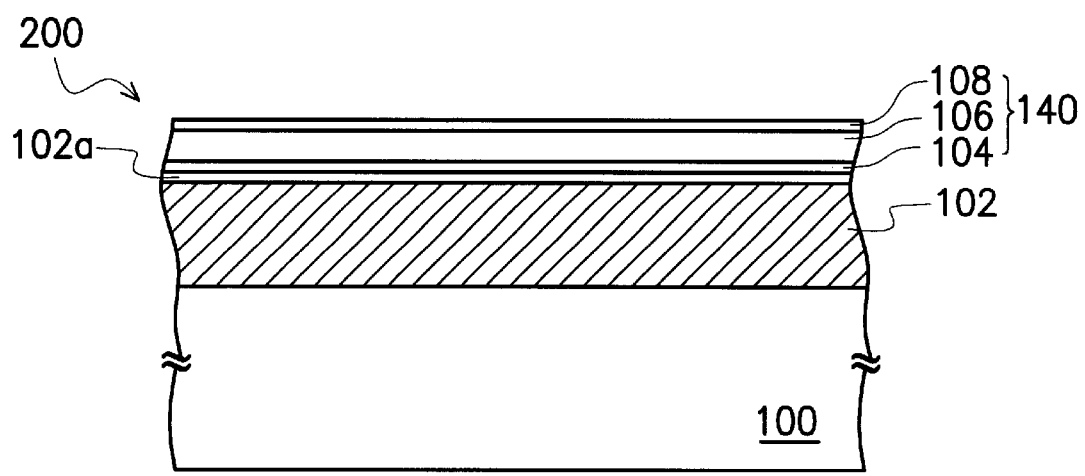

In FIG. 1C, in the same low pressure furnace, nitrogen monoxide ($N_2O$) or nitric oxide (NO) is infused into the low pressure furnace 300. An oxynitride layer 108 with a thickness less than about 15 angstroms is formed on the nitride layer 106. The reaction temperature for forming the oxynitride layer 108 is ranged between about 750–850 degree Celsius. An ONO structure is thus formed including the native oxide layer 104, the nitride layer 106 and the oxynitride layer 108. The formation of the oxynitride layer 108 reduce the amount of the dangling bonds of the nitride layer 106, so as to fill the pin holes within the nitride layer 106. Therefore, the possibility of causing a leakage current is minimized, and the breakdown voltage is increased. The capacitor can thus be applied to a high voltage operation. The oxynitride layer 108 can further avoid an ion penetration in the subsequent fabrication process which may cause negative influence of the capacitor. With the introduction of nitrogen monoxide ($N_2O$) or nitric oxide (NO), the $N_2O$ or NO gas may penetrate through the nitride layer 106 and even the native oxide layer 104 to reach the bottom electrode 102. An additional oxynitride layer 102a may be formed with a thickness less than about 10 angstroms. The formation of the oxynitride layer 102a has an effect to fill the pinholes of the silicon nitride. Therefore, a further leakage current and ion penetration can be prevented. In another aspect, the formation of the oxynitride layers 102a and 108 enhances the capacitor properties.

Figure 1D:
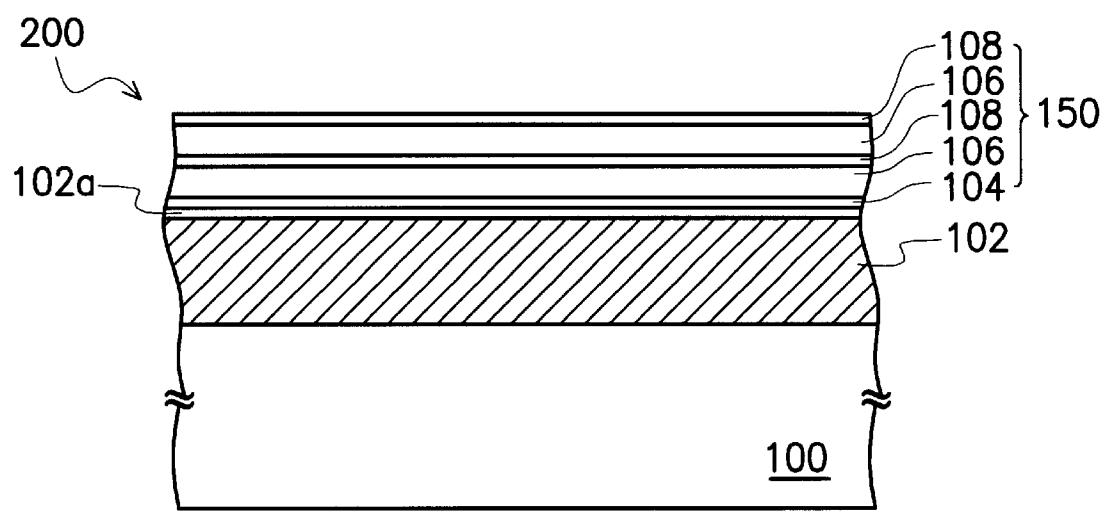
Figure 2:
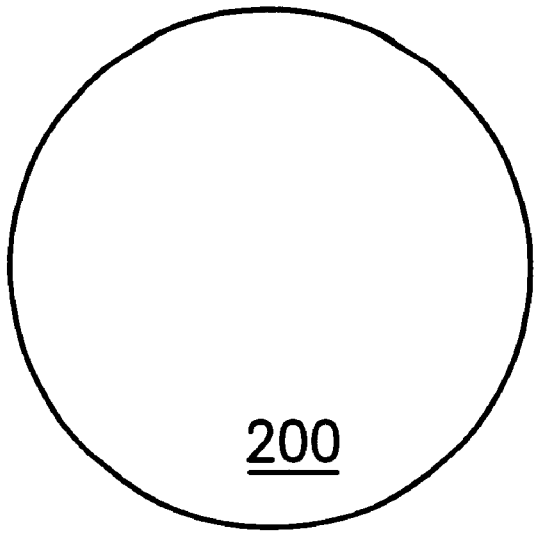
FIG. 2 illustrates schematic diagram of a chip used in FIG. 1A to FIG. 1D.
Figure 3:
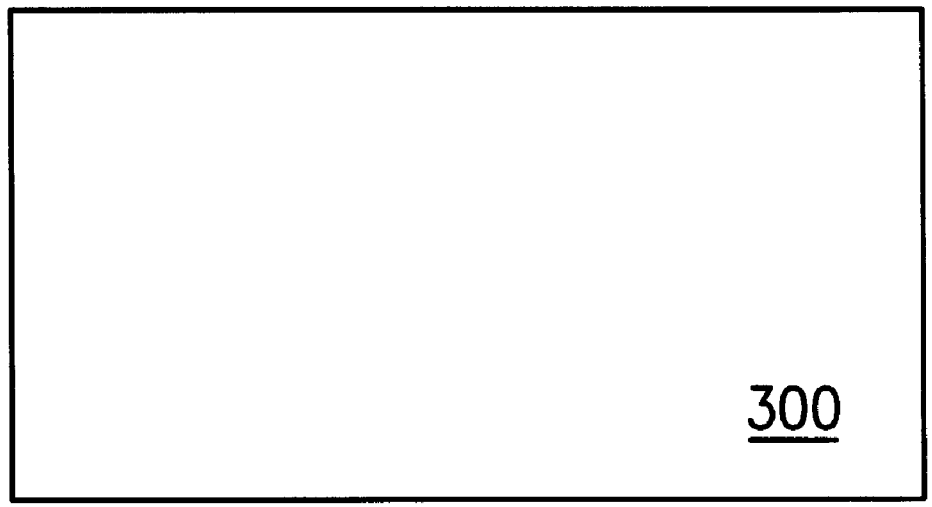
FIG. 3 is a schematic drawing of a low pressure vertical furnace used in the invention.

By controlling the flow rate of reacting gas, reaction pressure and temperation, and reaction time, the thickness of the nitride layer 106 and the oxynitride layer 108 can be adjusted as required. By repeating the above steps, dielectric layer such as ONONO structure 150 (as shown in FIG. 1D), ONONONO structure, or a structure comprise more stack layers of ON can be formed to achieve different capacitor properties.

The invention thus has at least the following advantages:

(1) The ONO structure is formed by an in situ process, that is, using a single furnace with introduction of different reaction gases. Therefore, the problems caused by transferring the chip from one furnace to another furnace is eliminated.

(2) The low pressure furnace can contain a larger number of chips compared to the furnace used in the conventional fabrication method, so that the throughput is enhanced.

(3) A thin oxynitride layer may be formed between the bottom electrode and the nitride layer, so that the pinholes in the silicon nitride layer can be filled thereby. As a consequence, the leakage current and ion penetration occurring in the capacitor formed by the conventional process can be prevented.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating capacitor dielectric layer, comprising:

providing a bottom electrode covered by a native oxide layer on a chip;

disposing the chip into a low pressure furnace to form a silicon nitride layer on the native oxide layer; and forming an oxynitride layer on the silicon nitride layer in the same low pressure furnace.

2. The method according to claim 1, wherein the silicon nitride layer is formed with a mixture of dichlorosilane and ammonia into the low pressure furnace.

3. The method according to claim 1, wherein the-silicon nitride layer is formed by heating up the low pressure furnace to a temperature range between about 750–850 degree Celsius.

4. The method according to claim 1, wherein the silicon nitride layer has a thickness of about 10–70 angstroms.

5. The method according to claim 1, wherein the oxynitride layer is formed by introducing nitrogen monoxide or nitric oxide into the low pressure furnace.

6. The method according to claim 1, wherein the oxynitride layer is formed by heating up the low pressure furnace to a temperature range between about 750–850 degree Celsius.

7. The method according to claim 1, wherein the oxynitride layer has a thickness less than about 15 angstroms.

8. A method of fabricating capacitor dielectric layer, comprising:

a) providing a bottom electrode covered by a native oxide layer on a chip;

b) disposing the chip into a low pressure furnace to form a silicon nitride layer on the native oxide layer;

c) forming an oxynitride layer on the silicon nitride layer in the same furnace; and d) repeating steps b) and c) to form a multi layer ONO structure.

9. The method according to claim 8, wherein the silicon nitride layer is formed with a mixture of dichlorosilane and ammonia into the low pressure furnace.

10. The method according to claim 8, wherein the silicon nitride layer is formed by heating up the low pressure furnace to a temperature range between about 750–850 degree Celsius.

11. The method according to claim 8, wherein the silicon nitride layer has a thickness of about 10–70 angstroms.

12. She method according to claim 8, wherein the oxynitride layer is formed by introducing nitrogen monoxide or nitric oxide into the low pressure furnace.

13. The method according to claim 8, wherein the oxynitride layer is formed by heating up the low pressure furnace to a temperature range between about 750–850 degree Celsius.

14. The method according to claim 8, wherein the oxynitride layer has a thickness less than about 15 angstroms.

15. A method of fabricating capacitor dielectric layer, comprising:

providing a bottom electrode covered by a native oxide layer on a chip;

disposing the chip into a low pressure furnace;

introducing dichlorosilane and ammonia into the low pressure furnace at a temperature ranged at about 750–850 degree Celsius; and introducing nitrogen monoxide or nitric oxide into the low pressure furnace at a temperature range at about 750–850 degree Celsius.

16. The method according to claim 15, wherein a silicon nitride layer is formed on the native oxide layer in the step of introducing dichlorosilane and ammonia.

17. The method according to claim 16, wherein an oxynitride layer is formed on the silicon nitride layer in the step of introducing monoxide or nitric oxide.

18. The method according to claim 16, wherein an oxynitride layer is formed to terminate dangling bonds of the silicon nitride layer in the step of introducing monoxide or nitric oxide.

19. The method according to claim 16, wherein an additional oxynitride layer is formed between the bottom electrode and the silicon nitride layer in the step of introducing monoxide or nitric oxide.

* * * * *